(12) United States Patent
Hosokawa (10) Patent No.: US 6,660,410 B2
(45) Date of Patent: Dec. 9, 2003

(54) ORGANIC ELECTROLUMINESCENCE ELEMENT

(75) Inventor: Chishio Hosokawa, Sodegaura (JP)

(73) Assignee: Idemitsu Kosan Co., Ltd. (JP)

( * ) Notice: Subject to any disclaimer, the term of this patent is extended or adjusted under 35 U.S.C. 154(b) by 47 days.

(21) Appl. No.: 09/816,415

(22) Filed: Mar. 26, 2001

(65) Prior Publication Data

US 2002/0045061 A1 Apr. 18, 2002

(30) Foreign Application Priority Data

Mar. 27, 2000 (JP) ........................................ 2000-087622

(51) Int. Cl.[7] .............................................. H05B 33/14
(52) U.S. Cl. ..................... 428/690; 428/917; 428/212; 313/504; 313/506; 257/102; 257/103
(58) Field of Search ................................ 428/690, 917, 428/212; 313/504, 506; 257/102, 103

(56) References Cited

U.S. PATENT DOCUMENTS

| | | | |
|---|---|---|---|
| 5,487,953 A | 1/1996 | Shirota et al. | 428/690 |
| 5,891,587 A | 4/1999 | Hu et al. | 428/690 |
| 6,310,360 B1 * | 10/2001 | Forrest et al. | 257/40 |
| 2002/0034656 A1 * | 3/2002 | Thompson et al. | 428/690 |

FOREIGN PATENT DOCUMENTS

| | | |
|---|---|---|
| EP | 0 517 542 | 12/1992 |
| EP | 0 936 844 | 8/1999 |
| JP | 3-289090 | 12/1991 |
| JP | 8-003547 | 1/1996 |
| JP | 9-298088 | 11/1997 |
| JP | 9-310066 | 12/1997 |
| JP | 10-316658 | 12/1998 |
| JP | 11-329737 | 11/1999 |
| JP | 2000-021572 | 1/2000 |
| JP | 2000-63335 | 2/2000 |
| JP | 2000-044519 | 2/2000 |

OTHER PUBLICATIONS

Tetsuo Tsutsui et al., "High Quantum Efficiency in Organic Light–Emitting Devices with Iridium–Complex as a Triplet Emissive Center" Jpn. J. Appl. Phys. vol. 38 (1999) pp. L1502–L1504 Part 2, No. 12B, Dec. 15, 1999, 1999 Publication Board, Japanese Journal of Applied Physics.

Baldo et al., Applied Physics Letters, "Very high–efficiency green organic light–emitting devices based on electrophosphorescence," 75(1) pp. 4–6, Jul. 1999.

* cited by examiner

*Primary Examiner*—Marie Yamnitzky
(74) *Attorney, Agent, or Firm*—Parkhurst & Wendel, L.L.P.

(57) ABSTRACT

An organic electroluminescence element comprising: an anode layer, a cathode layer, and an organic luminescence layer therebetween, the organic luminescence layer having a carbazole derivative with a glass-transition temperature of 110° C. or higher, and a phosphorescent dopant. This structure makes it possible to provide an organic electroluminescence element which can make use of the triplet exciton state of the carbazole derivative even at room temperature and which has a practical life and superior heat-resistance.

10 Claims, 1 Drawing Sheet

FIG. 1

ORGANIC ELECTROLUMINESCENCE ELEMENT

BACKGROUND OF THE INVENTION

1. Field of the Invention

The present invention relates to an organic electroluminescence element (which may be referred to as an organic EL element hereinafter). More specifically, the present invention relates to an organic EL element using a triplet exciton of an organic luminescence material (host material).

2. Description of the Related Art

Hitherto, organic EL elements wherein an organic luminescence layer is arranged between electrodes have been eagerly researched and developed for the following reasons and the like.

(1) Since these elements are completely solid, they are easy to handle and produce.

(2) Since they can emit light by themselves, no light emitting members are necessary.

(3) Since they can be clearly watched, they are suitable for display.

(4) They permit full color display easily.

The luminescence mechanism of such organic EL elements generally makes use of a luminescence phenomenon, which is energy conversion phenomenon caused when a fluorescent molecule in a singlet excited state (which may be referred to a S1 state) in an organic luminescence medium is transited to a ground state radially.

A fluorescent molecule in a triplet excited state (which may be referred to a T1 state) in an organic luminescence medium can be supposed. However, radiative transition to a ground state is forbidden; therefore, such a molecule is gradually transited from the triplet excited state to some other state by non-radiative transition. As a result, no fluorescence is emitted but thermal energy is radiated.

Here, singlet and triplet mean multiplicity of energy decided by combination of total spin angular momentum and total orbital angular momentum of a fluorescent molecule. Specifically, a singlet excited state is defined as an energy state in the case that a single electron is transited from a ground state, where no unpaired electrons are present, to a higher energy level without changing the spin state of the electron. A triplet excited state is defined as an energy state in the case that a single electron is transited to a higher energy level while the spin state of the electron is made reverse.

Needless to say, luminescence in a triplet excited state defined as above can be observed if the luminescence is caused at a very low temperature, for example, at a liquefaction temperature of liquid nitrogen (−196° C.). However, this temperature is not a practical temperature, and the amount of the luminescence is only a little.

By the way, the total efficiency of luminescence from any conventional organic EL element is related to recombination efficiency (φrec) of injected charged carries (electrons and holes), and the probability (φrad) that generated excitons cause radiative transition. Therefore, the total efficiency (φel) of luminescence from the organic EL element can be represented by the following equation:

$$\phi el = \phi rec \times 0.25 \phi rad$$

The coefficient (0.25) of φrad in the equation is decided from the matter that the probability that singlet excitons are generated is regarded as ¼. Therefore, even if recombination and radiative attenuation of excitons are caused with a probability coefficient of 1, the theoretical upper limit of luminescence efficiency of the organic EL element is 25%.

As described above, in any conventional organic EL element, triplet excitons cannot be substantially used and only singlet excitons cause radiative transition. Thus, a problem that the upper limit of the luminescence efficiency is low arises.

Thus, literature 1 "Jpn. J. Appl. Phys., 38 (1999) L1502" discloses that even at room temperature, triplet excitons (triplet excited state) of an organic luminescence material (host material) are used to transfer energy from the triplet excitons to a phosphorescent dopant, so as to generate a fluorescent luminescence phenomenon. More specifically, the literature 1 reports that a fluorescent luminescence phenomenon is caused in an organic EL element comprising an organic luminescence layer composed of 4,4-N,N-dicarbazolylbiphenyl represented by the following formula (6) and an Ir complex, which is a phosphorescent dopant.

(6)

However, the half-life of the organic EL element described in the literature 1 is below 150 hours, and the usefulness of the organic EL element is insufficient.

Thus, the inventor made eager investigations. As a result, the following has been found: the glass-transition temperature of 4,4-N,N-dicarbazolylbiphenyl is as low as less than 110° C.; therefore, if the biphenyl is combined with an Ir complex, crystallization is easily caused in the organic luminescence layer comprising the combination to make the life of an organic EL element short.

Incidentally, in the present situation, a demand that the heat-resistance of organic EL elements for cars should be made higher has been increasing in light of environment inside cars in summer.

Thus, an object of the present invention is to provide an organic EL element which makes it possible to use triplet excitons of an organic luminescence material (host material) even at room temperature to emit fluorescence (including phosphorescence); has a practical life span; and has a superior heat-resistance.

SUMMARY OF THE INVENTION

[1] According to the present invention, provided is an organic EL element comprising:
an anode layer,
a cathode layer, and
an organic luminescence layer therebetween, the organic luminescence layer having a carbazole derivative with a glass-transition temperature of 110° C. or higher, and a phosphorescent dopant. Thus, the above-mentioned problems can be solved.

This organic EL element makes it possible to use the triplet exciton state of the organic luminescence material even at room temperature. Moreover, this element has a practical life, for example, a half-time of 300 hours or more, and has superior heat-resistance. Thus, this element can be sufficiently used as an organic EL element for car.

[2] In the organic EL element of the present invention, it is preferred that the carbazole derivative is at least one of compounds represented by the following general formulae (1) to (4):

(1)

wherein $Ar^1$ is a substituted or non-substituted aryl group having 6 to 50 nucleus carbon atoms; $Ar^2$ to $Ar^7$ are each independently a substituted or non-substituted aryl or arylene group having 6 to 50 nucleus carbon atoms; $Ar^2$ and $Ar^3$, $Ar^4$ and $Ar^5$, or $Ar^6$ and $Ar^7$ may be connected to each other through a single bond or through O, S or substituted or non-substituted alkylene as a connecting group; and each of repetition numbers m and n is an integer of 0 to 3, (2)

wherein $R^1$ to $R^6$ are each independently a hydrogen or halogen atom, an alkyl, aralkyl, aryl, cycloalkyl, fluoroalkyl, amino, nitro, cyano, hydroxy, or alkoxy group; $R^7$ and $R^8$ are each independently a hydrogen atom, an alkyl, aralkyl, aryl, or cycloalkyl group; $X^1$ and $X^2$ are each independently a hydrogen atom, an alkyl, aralkyl, aryl, or cycloalkyl group; Y is a single bond, an alkyl, alkylene, cycloalkyl, aryl, or aralkyl chain; a repetition number p is an integer of 1 to 3.

(3)

wherein $Ar^8$ to $Ar^{11}$ are each independently an aryl group having 6 to 50 nucleus carbon atoms which may be substituted with an alkyl, alkoxy or aryl group; $Ar^8$ and $Ar^9$, or $Ar^{10}$ and $Ar^{11}$ may be connected to each other through a single bond or through O, S or substituted or non-substituted alkylene as a connecting group; and $R^9$ is an alkyl or alkoxy group, or a substituted or non-substituted aryl group having 6 to 18 nucleus carbon atoms.

(4)

wherein Z is a trivalent nitrogen atom or an aromatic group; $Ar^{12}$ to $Ar^{14}$ are each independently a group represented by the following general formula (5) or an aryl group having 6 to 50 nucleus carbon atoms; and at least two of $Ar^{12}$ to $Ar^{14}$ are groups represented by the following general formula (5):

(5)

wherein $R^{10}$ to $R^{21}$ are each independently an aryl group having 6 to 50 nucleus carbon atoms which may be substituted with an alkyl, alkoxy group having 1 to 6 carbon atoms, or a phenyl group; and groups adjacent to each other may form a cyclic structure; and a repetition number q is an integer of 0 to 3.

The organic EL element wherein this carbazole derivative is used as a host material in the organic luminescence layer makes it possible to use the triplet exciton state more effectively, and has a practical life span.

[3] In the organic EL element of the present invention, it is preferred that the carbazole derivative has at least two carbazole skeletons.

This carbazole derivative has a large triplet energy to make it possible to use the triplet exciton state more effectively even at room temperature (20° C.), and has a practical life span.

[4] In the organic EL element of the present invention, it is preferred that the relationship of E1>E2 is satisfied in which E1 represents the triplet energy of the carbazole derivative and E2 represents the triplet energy of the phosphorescent dopant.

This structure makes it possible to transfer the triplet energy of the carbazole derivative surely to the phosphorescent dopant, and to emit fluorescence using the triplet energy even at room temperature (20° C.).

[5] In the organic EL element of the present invention, it is preferred that the triplet energy (E1) of the carbazole derivative is a value of 21,000 cm$^{-1}$ or more.

A triplet energy of 21,000 cm$^{-1}$ corresponds to a light wavelength of 488 nm. On the contrary, various phosphorescent dopants generally have a triplet energy which is equal to or less than the energy which 488 nm light has. Therefore, by using the carbazole derivative having such a large triplet energy as above, various phosphorescent dopants can be used.

Thus, by selecting an appropriate kind of the phosphorescent dopant for the carbazole derivative having such a large triplet energy as above, luminescence in green, yellow, orange, vermilion, red and the like can easily be obtained.

[6] In the organic EL element of the present invention, it is preferred that the carbazole derivative has a cyclic structure whose triplet energy is a value of 21,000 cm$^{-1}$ or more, and the cyclic structure contains an aromatic ring, a hetero ring, or combination thereof.

This carbazole derivative makes it possible to transfer the triplet energy of the carbazole derivative more effectively to the phosphorescent dopant. Specifically, if the carbazole derivative has a cyclic structure having a triplet energy of less than 21,000 cm$^{-1}$, the triplet energy is transferred to this cyclic structure so that the triplet energy transferred to the phosphorescent dopant may be reduced.

[7] In the organic EL element of the present invention, it is preferred that the phosphorescent dopant is a metal complex comprising at least one metal selected from the group consisting of Ir (iridium), Ru (ruthenium), Pd (palladium), Pt (platinum), Os (osmium) and Re (rhenium).

This structure makes it possible to transfer energy effectively from the triplet exciton of the carbazole derivative as a host material to the metal complex as the phosphorescent dopant.

[8] In the organic EL element of the present invention, it is preferred that at least one ligand of the metal complex has at least one skeleton selected from the group consisting of phenylpyridine, bipyridyl and phenanthroline skeletons.

The bulky and electron-withdrawing skeleton(s) contained in the molecule makes it possible to transfer energy effectively from the triplet exciton of the carbazole derivative to the metal complex.

[9] In the organic EL element of the present invention, it is preferred that a blend amount of the phosphorescent dopant is 0.1 to 30 parts by weight per 100 parts of the carbazole derivative.

This structure makes it possible to mix the phosphorescent dopant with the carbazole derivative uniformly, and transfer energy effectively from the triplet exciton of the carbazole derivative to the phosphorescent dopant.

[10] In the organic EL element of the present invention, it is preferred that a hole barrier layer, an electron injection layer, or combination thereof is arranged between the anode layer and the cathode layer, and the hole barrier layer and the electron injection layer comprise an alkali metal.

This structure makes it possible to drive the organic EL element at a lower voltage, and make the life span of the element longer.

DETAILED DESCRIPTION OF THE PREFERRED EMBODIMENTS

Figure 1:
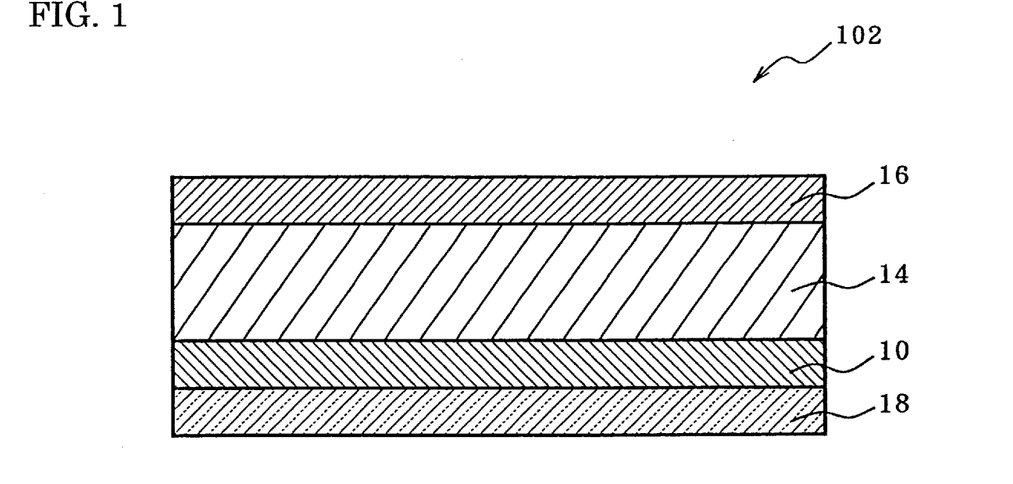
FIG. 1 is a view illustrating a basic structure of an organic EL element.

Referring to FIG. 1, embodiments of the organic EL elements of the present invention will be described. FIG. 1 is a sectional view of an organic EL element 102, and illustrates a structure wherein an anode layer 10, an organic luminescence layer 14 and a cathode layer 16 are successively deposited on a substrate 18.

The following will chiefly describe a carbazole derivative (host material) and a phosphorescent dopant that constitute the organic luminescence layer 14, which is a characteristic element in the present embodiment. Thus, the structure and the production process of the other elements, for example, the anode layer 10 and the cathode layer 16 will briefly be described. For elements which are not referred to, structures and production processes which are generally known in the field of organic EL elements can be adopted.

1. Carbazole Derivative (1) Kind 1

An embodiment of the present invention is characterized in that in the organic luminescence layer, a carbazole derivative with a glass-transition temperature of 110° C. or higher is used as a host material.

This is because if the host material is a carbazole derivative, the triplet exciton state of the carbazole derivative can be effectively used even at room temperature (20° C.) by combining the derivative with a phosphorescent dopant that will be described later. Specifically, a luminescence phenomenon can be caused by transferring energy effectively from the triplet state in the carbazole derivative to the phosphorescent dopant.

Such a carbazole derivative is preferably a carbazole derivative having at least two carbazole skeletons. This is because the glass-transition temperature and triplet energy that will be described later can easily be adjusted and the derivative can easily be mixed with the phosphorescent dopant.

The reason why the carbazole derivative having a glass-transition temperature of 110° C. or higher is used is as follows. If the glass-transition temperature is below 110° C., any combination thereof with the phosphorescent dopant is very easily crystallized so that the life becomes short. If the glass-transition temperature is below 110° C., a short circuit is easily caused in a short time when an electric current is passed through the derivative at a high temperature. Thus, the environment where the organic element EL is used is excessively restricted.

Therefore, the glass-transition temperature of the carbazole derivative is more preferably from 115 to 170° C., and still more preferably from 120 to 150° C.

The reason why the glass-transition temperature of the carbazole derivative is more preferably 170° C. or lower is that the kinds of carbazole derivatives having a glass-transition over 170° C. are excessively restricted and the handling of the derivatives becomes difficult because of a drop in their deposition ability.

A Differential Scanning Calorimeter (DSC) is used to make it possible to obtain the glass-transition temperature (Tg) of the carbazole derivative as a temperature of a change in the specific heat obtained when the derivative is heated at a temperature-rising rate of, for example, 10° C./minute in a nitrogen-circulating state.

(2) Kind 2

In the embodiment of the present invention, it is preferred that the relationship of E1>E2 is satisfied in which E1 represents the triplet energy of the carbazole derivative in the organic luminescence layer and E2 represents the triplet energy of the phosphorescent dopant therein.

By combining the carbazole derivative with the phosphorescent dopant with this relationship, the triplet exciton state of the carbazole derivative can surely be used even at room temperature. Specifically other words, a luminescence phenomenon can be caused by transferring energy certainly from the triplet state in the carbazole derivative to the phosphorescent dopant.

It is also preferred that the triplet energy (E1) of the carbazole derivative is set to a value of 21,000 cm$^{-1}$ or more.

Specifically, the triplet energy, 21,000 cm$^{-1}$ corresponds to a light wavelength of 488 nm. In general, various phosphorescent dopants have a triplet energy which is equal to or less than the energy which 488 nm light has. Therefore, one or more selected from various phosphorescent dopants can be combined with the carbazole derivative.

Thus, by selecting the kind of the phosphorescent dopant appropriately, luminescence in green, yellow, orange, vermilion, red and the like can be obtained.

Moreover, by setting the triplet energy (E1) of the carbazole derivative to a value of 22,500 cm$^{-1}$ or more, luminescence in blue also can be obtained easily.

Preferably, the carbazole derivative has a cyclic structure whose triplet energy is a value of 21,000 cm$^{-1}$ or more and the cyclic structure contains an aromatic ring, a hetero ring, or combination one thereof.

If the carbazole derivative has such a cyclic structure, the triplet exciton state of the carbazole derivative can be effectively used even at room temperature by combining the carbazole derivative with the phosphorescent dopant. That is, by causing the carbazole derivative to have, for example, a cyclic structure wherein 9-arylcarbazole is connected to a bivalent or trivalent group consisting an aromatic ring, the triplet energy can be set to 22,500 cm$^{-1}$ or less. Therefore, if the carbazole derivative has such a cyclic structure, the frequency that the triplet energy of 21,000 cm, originating from the carbazole group, is transferred in the molecule becomes small. Thus, the triplet energy which is transferred to the phosphorescent dopant becomes relatively large.

(3) Kind 3

It is preferred to use, as the above-mentioned carbazole derivative, carbazole derivatives represented by the general formulae (1) to (4) alone or in combination of two or more.

In the general formulae (1) to (4) representing preferred carbazole derivatives, examples of preferred aryl groups having 5 to 50 nucleus atoms include phenyl, naphthyl, anthranyl, phenanthryl, pyrenyl, coronyl, biphenyl, terphenyl, pyrrolyl, furanyl, thiophenyl, benzothiophenyl, oxadiazolyl, diphenylanthranyl, indolyl, carbazolyl, pyridyl, and benzoquinolyl, and the like.

Examples of preferred arylene groups having 5 to 50 nucleus atoms include phenylene, naphthylene, anthranylene, phenanthrylene, pyrenylene, coronylene, biphenylene, terphenylene, pyrrolylene, furanylene, thiophenylene, benzothiophenylene, oxadiazolylene, diphenylanthranylene, indolylene, carbazolylene, pyridylene, and benzoquinolylene, and the like.

The aromatic group having 6 to 50 carbon atoms may be substituted with one or more substituents. Preferred examples of the substituent include alkyl groups having 1 to 6 carbon atoms (such as methyl, ethyl, i-propyl, n-propyl, s-butyl, t-butyl, pentyl, hexyl, cyclopentyl and cyclohexyl groups); alkoxy groups having 1–6 carbon atoms (such as methoxy, ethoxy, i-propoxy, n-propoxy, s-butoxy, t-butoxy, pentoxy, hexyloxy, cyclopentoxy and cyclohexyloxy groups); aryl groups having 5 to 50 nucleus atoms; amino groups substituted with an aryl group having 5 to 50 nucleus atoms; ester groups having an aryl group having 5 to 50 nucleus atoms; ester groups having an alkyl group having 1 to 6 carbon atoms; a cyano group; a nitro group; halogen atoms. The above-mentioned substituent may be substituted with a carbazolyl group.

Moreover, as shown in the general formulae (1) and (3) described below, the carbazole in the present invention is interpreted as a moiety formed by connecting at least two aryl groups, each of which is connected to a nitrogen atom, to each other through a single bond or a connecting groups. In this case, preferred examples of the connecting groups include O, S, and substituted or non-substituted alkylene and silylene, and the like.

Here, preferred specific examples of the carbazole derivative represented by the formula (1) include a group of compounds illustrated as the following chemical formulae (7) to (24).

(7)

(8)

(9)

(10)

(11)

(12)

(13)

(14)

(15)

(16)

(17)

(18)

(19)

(20)

(21)

(22)

(23)

-continued

(24)

Preferred specific examples of the carbazole derivative represented by the formula (2) include a group of compounds illustrated as the following chemical formulae (25) to (29). In the formula, a methyl group may be abbreviated to Me.

(25)

(26)

-continued

(27)

(28)

(29)

Preferred specific examples of the carbazole derivative represented by the formula (3) include a group of compounds illustrated as the following chemical formulae (30) to (41).

(30)

(33)

(34)

(31)

(35)

(32)

(36)

(37)

(40)

(38)

(41)

(39)

Preferred specific examples of the carbazole derivative represented by the formula (4) include a group of compounds illustrated as the following chemical formulae (42) to (49).

(42)

-continued

(43)

(44)

(45)

-continued (46)

(47)

(48)

(49)

(53)

Furthermore, specific examples of the carbazole derivative having a structure other than the structures represented by the general formulae (1) to (4) include a group of compounds illustrated as the following chemical formulae (50) to (59).

(54)

(50)

(55)

(51)

(56)

(57)

(52)

(58)

-continued (59)

wherein a repetition number is an integer of 3 to 20.

2. Phosphorescent Dopant
(1) Kind
① Metal Complex

The phosphorescent dopant is preferably a metal complex comprising at least one metal selected from the group consisting of Ir, Ru, Pd, Pt, Os and Re.

This is because if the phosphorescent dopant is any one of these metal complexes, energy can be effectively transferred from triplet excitons of the carbazole derivative as a host material to the phosphorescent dopant.

More specific examples of the phosphorescent dopant are metal complexes such as tris(2-phenylpyridine) iridium, tris(2-phenylpyridine) ruthenium, tris(2-phenylpyridine) palladium, bis(2-phenylpyridine) platinum, tris(2-phenylpyridine) osmium, tris(2-phenylpyridine) rhenium, octaethyl platinum porphyrin, octaphenyl platinum porphyrin, octaethyl palladium porphyrin, and octaphenyl palladium porphyrin. In order to transfer energy more effectively to emit fluorescence, more preferred are metal complexes comprising Ir, for example, tris(2-phenylpyridine) iridium represented by the following formula (60):

(60)

② Ligand of the Metal Complex

At least one ligand of the metal complex preferably has at least one skeleton selected from the group consisting of phenylpyridine, bipyridyl and phenanthroline skeletons.

This is because by at least one of these electron withdrawing skeletons contained in the molecule, energy can be effectively transferred from the triplet excitons of the carbazole derivative to the metal complex.

Particularly, in the phosphorescent dopant, the ligand preferably has a phenylpyridine skeleton among these skeletons, such as tris(2-phenylpyridine) iridium.

(2) Added Amount

A blend amount of the phosphorescent dopant is preferably 0.1 to 30 parts by weight per 100 parts by weight of the blended carbazole derivative (host material).

The reasons for this are as follows. If the blend amount of the phosphorescent dopant is below 0.1 part by weight, the effect based on the blend is not exhibited so that energy may not be effectively transferred from triplet excitons of the carbazole derivative. On the other hand, if the blend amount of the phosphorescent dopant is over 30 parts by weight, the phosphorescent dopant is not easily blended with the carbazole derivative uniformly so that luminescence brightness may be scattered.

Therefore, the blend amount of the phosphorescent dopant is more preferably 0.5 to 20 parts by weight, and is still more preferably 1 to 15 parts by weight.

3. Other Organic Layers in the Organic Luminescence Medium (1) Hole Injection Layer It is preferred to deposit a hole injection layer having a thickness of 5 nm to 5 μm. The deposition of such a hole injection layer makes it possible to inject holes satisfactorily into the organic luminescence layer, give a high luminescence brightness, and attain driving at a low voltage.

It is also preferred to use, in the hole injection layer in the organic luminescence medium, a compound having a hole mobility of $1\times10^{-6}$ $cm^2/V$·second or more and an ionization energy of 5.5 eV or less. The hole mobility is measured when a voltage of $1\times10^4$ to $1\times10^6$ V/cm is applied to the hole injection layer.

Specific examples of the constituent material of the hole injection layer are organic compounds such as porphyrin compounds, aromatic tertiary amine compounds, styrylamine compounds, aromatic dimethylidyne compounds, and condensed aromatic ring compounds, for example, 4,4'-bis[N-(1-naphthyl)-N-phenylamino]biphenyl (abbreviated to NPD) and 4,4',4"-tris[N-(3-methylphenyl)-N-phenylamino]triphenylamine (abbreviated to MTDATA).

As the constituent material of the hole injection layer, an inorganic compound such as p-type Si or p-type SiC is preferably used.

It is also preferred to arrange an organic semiconductor layer having an electric conductivity of $1\times10^{-10}$ S/cm or more between the hole injection layer and the anode layer, or between the hole injection layer and the organic luminescence layer. The arrangement of the organic semiconductor layer makes the injection of holes into the organic luminescence layer more satisfactory.

(2) Electron Injection Layer

It is preferred to deposit an electron injection layer having a thickness of 5 nm to 5 μm. The deposition of such an electron injection layer makes it possible to inject electrons satisfactorily into the organic luminescence layer, give a high luminescence brightness, and attain driving at a low voltage.

It is also preferred to use, in the electron injection layer, a compound having an electron mobility of $1\times10^{-6}$ $cm^2/$V·second or more and an ionization energy over 5.5 eV. The electron mobility is measured when a voltage of $1\times10^4$ to $1\times10^6$ V/cm is applied to the electron injection layer.

Specific examples of the constituent material of the electron injection layer are metal complexes of 8-hydroxyquinoline (Al chelate: Alq), derivatives thereof, and oxadiazole derivatives.

If an alkali metal is incorporated into the electron injection layer in the same way as into a hole barrier layer that will be described later, the organic EL element can be driven at a notably low voltage and the life thereof can be made longer.

(3) Hole Barrier Layer

It is preferred to arrange a hole barrier layer having a thickness of 5 nm to 5 μm between the organic luminescence layer and the cathode. The arrangement of the hole barrier layer makes it possible to improve capability of confining holes in the organic luminescence layer, give a high luminescence brightness, and attain driving at a low voltage.

Examples of the constituent material of the hole barrier layer include 2,9-diemthyl-4,7-diphenyl-1,10-phenanthroline and 2,9-diethyl-4,7-diphenyl-1,10-phenanthroline, and the like. More preferably, an alkali metal such as Li or Cs is further added thereto.

The combination of the alkali metal with the hole barrier layer constituting material in the hole barrier layer makes it possible to drive the organic EL element at a notably low voltage and make the life thereof longer.

When the alkali metal is incorporated, the amount thereof is preferably 0.01 to 30% by weight. (if the total amount of the hole barrier layer is 100% by weight)

If the amount of the alkali metal is below 0.01% by weight, the effect of the addition thereof may be not exhibited. On the other hand, if the amount is over 30% by weight, the dispersion of the alkali metal becomes uneven so that luminescence brightness may be scattered.

Therefore, the amount of the alkali metal is more preferably 0.05 to 20% by weight, and more still preferably 0.1 to 15% by weight.

4. Electrode (1) Anode Layer

The anode layer corresponds to a lower electrode or an opposite electrode, dependently on the structure of the organic EL display device. The anode layer is preferably made of a metal, an alloy or an electrically conductive compound having a large work function (for example, 4.0 eV or more), or a mixture thereof. Specifically, it is preferred to use one or a combination of two or more electrode materials selected from indium tin oxide (ITO), indium zinc oxide (IZO), copper iodide (CuI), tin oxide ($SnO_2$), zinc oxide (ZnO), gold, platinum, palladium and the like.

By using these electrode materials, the anode layer having a uniform thickness can be made using a method making deposition in a dry state possible, such as vacuum evaporation, sputtering, ion plating, electron beam evaporation, CVD (Chemical Vapor Deposition), MOCVD (Metal Oxide Chemical Vapor Deposition), or plasma CVD.

When EL luminescence is taken out from the anode layer, it is necessary to make the anode layer to a transparent electrode. In this case, it is preferred to use an electrically conductive material such as ITO, IZO, CuI, $SnO_2$ or ZnO to set the transmissivity of EL luminescence to a value of 70% or more.

The thickness of the anode layer is not particularly limited. The thickness is preferably a value of 10 to 1,000 nm, and more preferably a value of 10 to 200 nm.

If the thickness of the anode layer is set to a value within such a range, uniform thickness distribution can be obtained and the transmissivity of EL luminescence can be made to 70% or more. Moreover, the sheet resistivity of the anode layer can be made to a value of 1000 $\Omega/\square$ or less, and preferably 100 $\Omega/\square$ or less.

It is also preferred that light is emitted from an arbitrary pixel in the luminescence face by depositing the anode layer (lower electrode), the organic luminescence medium, and the cathode layer (opposite electrode) successively and making the lower electrode and the opposite electrode into an XY matrix pattern. By making the anode and so on into this manner, various data can easily be displayed in the organic EL element.

(2) Cathode Layer

The cathode layer also corresponds to a lower electrode or an opposite electrode, dependently on the structure of the organic EL display device. The cathode layer is preferably made of a metal, an alloy or an electrically conductive compound having a small work function (for example, less than 4.0 eV), or a mixture thereof.

Specifically, it is preferred to use any one or a combination of two or more electrode materials selected from sodium, sodium-potassium alloy, cesium, magnesium, lithium, magnesium-silver alloy, aluminum, aluminum oxide, aluminum-lithium alloy, indium, a rare earth metal, a mixture of an organic luminescence medium material and these metals, a mixture of an electron injection layer material and these metals, and the like.

The thickness of the cathode layer is not particularly limited. The thickness is preferably a value of 10 to 1,000 nm, and more preferably a value of 10 to 200 nm.

Furthermore, when EL luminescence is taken out from the cathode layer, it is necessary to make the cathode layer to a transparent electrode. In this case, it is preferred to set the transmissivity of EL luminescence to a value of 70% or more.

The cathode layer is preferably formed by a method making deposition in a dry state possible, such as vacuum evaporation or sputtering, in the same way as for the anode layer.

5. Supporting Substrate

The supporting substrate in the organic EL element is preferably a substrate which has superior mechanical strength and small permeability of moisture or oxygen. Specific examples thereof include glass plates, metal plates, ceramic plates and plastic plates (such as polycarbonate resin, acrylic resin, vinyl chloride resin, polyethylene terephthalate resin, polyimide resin, polyester resin, epoxy resin, phenol resin, silicone resin, and fluorine resin plates) and the like.

To avoid invasion of moisture into the organic EL element, it is preferred to form an inorganic film or apply a fluorine resin onto the supporting substrate made of such a material as above to conduct moisture-proof treatment or hydrophobic treatment.

Particularly to avoid invasion of moisture into the organic luminescence medium, it is preferred to make the water content in the supporting substrate and the gas transmissivity thereof small. Specifically, it is preferred to set the water content in the supporting substrate to 0.0001% or less by weight and set the gas transmissivity thereof to $1 \times 10^{-13}$ cc·cm/$cm^2$·sec. cmHg or less.

EXAMPLE

Example 1

Production of an Organic EL Element

① Washing

A glass substrate (made by Geomatic company) 25 mm in width, 75 mm in length and 1.1 mm in thickness, with ITO transparent electrodes, was subjected to ultrasonic washing in isopropyl alcohol for 5 minutes and subjected to UV ozone washing for 30 minutes.

② Formation of a Hole Injection Layer

The washed glass substrate with the ITO transparent electrodes was set to a substrate holder in a vacuum evaporation device, and then N,N-bis(N,N-diphenyl-4-aminophenyl)-N,N-diphenyl-4,4'-diamino-1,1'-biphenyl (abbreviated to TPD232 hereinafter) was vapor-deposited on the substrate at a vacuum degree of $665 \times 10^{-7}$ Pa and a vapor-deposition rate of 0.1 to 0.3 nm/sec., so as to form a first hole injection layer (which also had a function as a hole transport layer) having a thickness of 60 nm.

4,4-Bis[N-(1-naphtyl)-N-phenylamino]biphenyl (abbreviated to NPD hereinafter) was vapor-deposited on the TPD232 film at a vacuum degree of $665 \times 10^{-7}$ Pa and a vapor-deposition rate of 0.1 to 0.3 nm/sec., so as to form a second hole injection layer (which also had a function as a hole transport layer) having a thickness of 20 nm.

③ Formation of an Organic Luminescence Layer

Next, the same vacuum evaporation device was used to vapor-deposit a carbazole compound (Tg: 110° C. or higher) represented by the formula (9) on the NPD film formed in the previous step at a vacuum degree of $665 \times 10^{-7}$ Pa and a vapor-deposition rate of 0.1 to 0.3 nm/sec., so as to form an organic luminescence layer having a thickness of 30 nm.

In this case, at the same time of the vapor deposition of the carbazole derivative compound represented by the formula (9), tris(2-phenylpyridine) iridium was vapor-deposited as a phosphorescent dopant. In this vapor co-deposition, the vapor-deposition rate of the phosphorescent dopant was adjusted in the manner that the ratio of the amount of the blended phosphorescent dopant to the total amount of the organic luminescence layer would be 7% by weight. (if the total amount of the organic luminescence layer is 100% by weight)

④ Formation of a Hole Barrier Layer Next, the same vacuum evaporation device was used to vapor-deposit 2,9-dimethyl-4,7-diphenyl-1,10-phenanthroline (abbreviated to BCP hereinafter) on the organic luminescence layer formed in the previous step at a vacuum degree of $665 \times 10^{-7}$ Pa and a vapor-deposition rate of 0.1 to 0.3 nm/sec., so as to form an organic luminescence layer having a thickness of 10 nm.

⑤ Formation of an Electron Injection Layer

Next, the same vacuum evaporation device was used to deposit a tris(8-quinolinol) aluminum film (abbreviated to an Alq film hereinafter) on the hole barrier layer formed in the previous step at a vacuum degree of $665 \times 10^{-7}$ Pa and a vapor-deposition rate of 0.1 to 0.3 nm/sec., so as to form an electron injection layer.

At this time, Li (Li source made by Saesu getter company) and Alq were subjected to vapor co-deposition in the manner that the molar ratio between them would be 1:1, so that the electron injection layer was made to an Alq/Li film having a thickness of 20 nm.

⑥ Formation of a Cathode

Next, the same vacuum evaporation device was used to vapor-deposit metal Al on the electron injection layer formed in the previous step at a vacuum degree of $665 \times 10^{-7}$ Pa and a vapor-deposition rate of 0.5 to 1.0 nm/sec., so as to form a cathode having a thickness of 150 nm.

⑦ Sealing Step

The resultant organic EL element was put into a dry box into which nitrogen was introduced. Furthermore, its luminescence face was coated with blue glass and the periphery thereof was treated with a cation-setting adhesive TB3102 (made by Three Bond Co., Ltd.) to perform sealing.

In this way, the organic EL element of Example 1 was prepared.

Evaluation of the Organic EL Element

A DC voltage of 6 V was applied between the anode and the cathode in the resultant organic EL element, so that green luminescence having a luminescence brightness of 1,200 cd/m$^2$ and a luminescence efficiency of 40 cd/A was obtained.

The organic EL element was driven at a low voltage. The initial brightness thereof was set to 500 cd/m$^2$. In this way, a life span test was performed. As a result, the half-time, which is a driving time until the initial brightness becomes half, was 500 hours. This half-time is practical.

A current-sending test as a heat-resistance test was performed at 85° C. Even after current was sent for 200 hours, green luminescence having sufficient luminescence brightness was obtained.

The obtained results are shown in Table 1.

Example 2

An organic EL element was produced and evaluated in the same way as in Example 1 except that at the time of vapor-depositing BCP for the hole barrier layer in Example 1, metal Li, which is an alkali metal, and BCP were subjected to vapor co-deposition at a molar ratio of 1:1.

As a result, even by application of a DC voltage of 5 V, green luminescence having a luminescence brightness of 1,300 cd/m$^2$ and a luminescence efficiency of 37 cd/A was obtained.

The organic EL element was driven at a low voltage. The initial brightness thereof was set to 500 cd/m$^2$. In this way, a life span test was performed, so that the half-time was 700 hours.

A current-sending test as a heat-resistance test was performed at 85° C. Even after current was sent for 200 hours, green luminescence having sufficient luminescence brightness was obtained.

Example 3

An organic EL element was produced and evaluated in the same way as in Example 1 except that at the time of vapor-depositing BCP for the hole barrier layer in Example 1, metal Cs, which is an alkali metal, and BCP were subjected to vapor co-deposition at a molar ratio of 1:1.

As a result, even by application of a DC voltage of 4.5 V, green luminescence having a luminescence brightness of 1,200 cd/m$^2$ and a luminescence efficiency of 40 cd/A was obtained.

The organic EL element was driven at a low voltage. The initial brightness thereof was set to 500 cd/m$^2$. In this way, a life span test was performed, so that the half-time was 800 hours.

A current-sending test as a heat-resistance test was performed at 85° C. Even after current was sent for 200 hours, green luminescence having sufficient luminescence brightness was obtained.

Comparative Example 1

An organic EL element was produced and evaluated in the same way as in Example 1 except that instead of the carbazole compound represented by the formula (9), a carbazole compound (Tg: less than 110° C.) represented by the formula (6) was used in the organic luminescence layer.

As a result, by application of a DC voltage of 6 V, green luminescence having a luminescence brightness of 1,100 cd/m$^2$ and a luminescence efficiency of 38 cd/A was obtained.

The organic EL element was driven at a low voltage. The initial brightness thereof was set to 500 cd/m$^2$. In this way, a life span test was performed. However, the half-time was as short as 150 hours. This half-time is not practically allowable.

A current-sending test as a heat-resistance test was performed at a high temperature of 85° C. A short circuit was caused after 100 hours. The organic EL element was unable to be lighted.

This demonstrated that the organic EL element of Comparative Example 1 had poor heat-resistance and was unable to be used for car.

TABLE 1

| | Organic luminescence layer Tg (° C.) | Hole barrier layer | Voltage (V) | Luminescence brightness (nit) | Luminescence efficiency (cd/A) | Luminescence color | Half-time (hours) | 85° C. current-sending test (hours) |
|---|---|---|---|---|---|---|---|---|
| Example 1 | Formula (9) > 110 | Only BCP | 6 | 1200 | 40 | Green | 500 | >200 |
| Example 2 | Formula (9) > 110 | BCP/Li = 1/1 | 5 | 1300 | 37 | Green | 700 | >200 |
| Example 3 | Formula (9) > 110 | BCP/Cs = 1/1 | 4.5 | 1200 | 40 | Green | 800 | >200 |
| Comparative Example 1 | Formula (6) > 110 | Only BCP | 6 | 1100 | 38 | Green | 150 | <200 |

Examples 4 to 9

An organic EL element was produced and evaluated in the same way as in Example 1 except that instead of the compound represented by the formula (9) of Example 1, each of compounds represented by the formulae (10), (19), (26), (30), (43) and (55) was used as a carbazole compound. The obtained results are shown in Table 2.

TABLE 2

| | Organic luminescence layer Tg (° C.) | Hole barrier layer | Voltage (V) | Luminescence brightness (nit) | Luminescence efficiency (cd/A) | Luminescence color | Half-time (hours) | 85° C. current-sending test (hours) |
|---|---|---|---|---|---|---|---|---|
| Example 4 | Formula (10) > 120 | Only BCP | 6 | 1050 | 35 | Green | 450 | >200 |
| Example 5 | Formula (19) > 110 | Only BCP | 6 | 600 | 18 | Green | 350 | >200 |
| Example 6 | Formula (26) > 110 | Only BCP | 6 | 450 | 10 | Green | 300 | >200 |
| Example 7 | Formula (30) > 110 | Only BCP | 6 | 890 | 28 | Green | 400 | >200 |
| Example 8 | Formula (43) > 140 | Only BCP | 6 | 920 | 30 | Green | 550 | >200 |
| Example 9 | Formula (55) > 110 | Only BCP | 6 | 350 | 10 | Green | 400 | >200 |

Industrially Applicability

According to the organic EL element of the present invention, its organic luminescence medium comprises a carbazole derivative with a glass-transition temperature of 110° C. or higher, and a phosphorescent dopant, so that the triplet exciton state of the carbazole derivative can be used even at room temperature and this element has a practical life and superior heat-resistance.

What is claimed is:

1. An organic electroluminescence element comprising:
   an anode layer,
   a cathode layer, and
   an organic luminescence layer therebetween, the organic luminescence layer having a carbazole derivative with a glass-transition temperature of 110° C. or higher, and a phosphorescent dopant, the carbazole derivative being at least one of the compounds or a compound from the compounds of the following general formulae (1) to (4):

(1)

wherein is

$Ar^1$ is a substituted or non-substituted phenyl, biphenyl, terphenyl, quaterphenyl, naphthyl or carbazolylphenyl group;

is each independently a carbazolyl group,

-continued at least one of $Ar^1$, contains a carbazole group; and m and n is 0 or 1;

(2)

wherein $R^1$ to $R^8$ are each independently a hydrogen or alkyl group; $X^1$ and $X^2$ are each independently an alkyl, or alkyl-substituted or non-substituted phenyl or biphenyl group;

Y is phenylene or biphenylene; and p is 2 or 3;

(3)

wherein is each independently a carbazolyl group, $R^9$ is an alkyl-substituted or non-substituted phenyl, biphenyl, terphenyl, naphthyl, carbazolyl group or ; and and at least one of $R^9$, contains a carbazolyl group; and (4)

wherein Z is a trivalent nitrogen atom or benzenetriyl group; and $Ar^{12}$ to $Ar^{14}$ are each independently a carbazolyl, carbazolylphenyl, carbazolylbiphenyl, carbazolylnaphthyl group or provided that all $Ar^{12}$ to $Ar^{14}$ are not the same group.

2. The organic electroluminescence element according to claim 1, wherein the carbazole derivative is a compound of the formula:

3. The organic electroluminescence element according to claim 1, wherein the carbazole derivative has at least two carbazole skeletons.

4. The organic electroluminescence element according to claim 1, wherein a relationship of E1>E2 is satisfied in which E1 represents the triplet energy of the carbazole derivative and E2 represents the triplet energy of the phosphorescent dopant.

5. The organic electroluminescence element according to claim 1, wherein the triplet energy E1 of the carbazole derivative is at least 21,000 $cm^{-1}$.

6. The organic electroluminescence element according to claim 1, wherein the carbazole derivative has a cyclic structure, the triplet energy of the cyclic structure being at least 21,000 $cm^{-1}$, and the cyclic structure contains an aromatic ring, a hetero ring, or a combination thereof.

7. The organic electroluminescence element according to claim 1, wherein the phosphorescent dopant is a metal complex comprising at least one metal selected from the group consisting of Ir, Ru, Pd, Pt, Os and Re.

8. The organic electroluminescence element according to claim 7, wherein at least one ligand of the metal complex has at least one skeleton selected from the group consisting of phenylpyridine, bipyridyl and phenanthroline skeletons.

9. The organic electroluminescence element according to claim 1, wherein the phosphorescent dopant is present in an amount of 0.1 to 30 parts by weight per 100 parts of the carbazole derivative.

10. The organic electroluminescence element according to claim 1, wherein a hole barrier layer, an electron injection layer, or combination thereof is arranged between the anode layer and the cathode layer, and the hole barrier layer and the electron injection layer comprise an alkali metal.

* * * * *